United States Patent
Mandal et al.

(10) Patent No.: US 11,751,360 B2
(45) Date of Patent: Sep. 5, 2023

(54) INTELLIGENTLY DEPLOYED COOLING FINS

(71) Applicant: International Business Machines Corporation, Armonk, NY (US)

(72) Inventors: Sushanta Mandal, Kolkata (IN); Kaushik Das, Kolkata (IN); Sarbajit K. Rakshit, Kolkata (IN)

(73) Assignee: International Business Machines Corporation, Armonk, NY (US)

(*) Notice: Subject to any disclaimer, the term of this patent is extended or adjusted under 35 U.S.C. 154(b) by 630 days.

(21) Appl. No.: 16/821,004

(22) Filed: Mar. 17, 2020

(65) Prior Publication Data

US 2021/0298206 A1  Sep. 23, 2021

(51) Int. Cl.
*H05K 7/20* (2006.01)

(52) U.S. Cl.
CPC ................. *H05K 7/20836* (2013.01)

(58) Field of Classification Search
CPC .......... H05K 7/20836; H05K 7/20209; H05K 7/20172; H05K 7/1498; H05K 7/20; H05K 7/207; H05K 7/20145; H05K 7/20727; H05K 7/20154; H05K 1/0203; H05K 7/20181; G06F 1/206; G06F 1/20; G06F 11/3058; G06F 2209/5019; G06F 1/32; G06F 11/079; G06N 20/00; G06N 3/08; G06N 3/084; G06N 3/02; G06N 3/0445; G06N 5/04; Y02D 10/00; Y02B 30/70; G05B 15/02; G05B 19/042; G05B 13/0265; G05B 2219/2614; G05B 13/026; G05B 13/027; G05B 13/028; G05B 2219/49216; G05B 13/021; G05B 13/04; G05B 13/042; G05B 13/048; G05B 17/02;

(Continued)

(56) References Cited

U.S. PATENT DOCUMENTS

| | | | | | |
|---|---|---|---|---|---|
| 5,065,844 | A | * | 11/1991 | Hon | .......................... B66B 9/04 91/171 |
| 6,643,128 | B2 | * | 11/2003 | Chu | .................... H05K 7/20836 361/679.48 |

(Continued)

FOREIGN PATENT DOCUMENTS

CN  107787168 B  10/2017

OTHER PUBLICATIONS

"Self adjusting fin spacing heatsink for Efficient Cooling of the device and system in which it is contained," An IP.com Prior Art Database Technical Disclosure, Oct. 18, 2011, 5 pages, https://priorart.ip.com/IPCOM/000211784.

(Continued)

*Primary Examiner* — Darrin D Dunn
(74) *Attorney, Agent, or Firm* — Peter J. Edwards

(57) ABSTRACT

A method of customizing the cooling of a first heat-producing system comprises selecting a first set of cooling fins with a deployment level. The method also comprises analyzing environmental data for an environment associated with the first set of cooling fins. The method also comprises quantifying a cooling benefit of the deployment level. The method also comprises quantifying an airflow detriment of the deployment level. The method also comprises determining that the airflow detriment outweighs the cooling benefit. The method also comprises reducing the deployment level based on the determination.

20 Claims, 6 Drawing Sheets

(58) Field of Classification Search
CPC ........... G05B 2219/21156; G05B 2219/25255; G05B 2219/2642; G05B 23/0208; G05B 23/0229; G05B 23/0235; G05B 23/0286; G05B 23/0289; G05B 23/0294; F24F 11/30; F24F 11/62; F24F 11/46; F24F 2140/60; F24F 11/72; F24F 2110/00; F24F 11/79; G05D 23/00; G05D 23/1928; G06Q 10/04; G06Q 10/063; G06Q 10/0639

See application file for complete search history.

(56) References Cited

U.S. PATENT DOCUMENTS

| | | | | |
|---|---|---|---|---|
| 7,054,156 B2* | 5/2006 | Espinoza-Ibarra | ... | F04D 29/366 416/1 |
| 7,179,046 B2* | 2/2007 | Hopkins | ............. | F04D 27/0261 415/61 |
| 7,330,770 B2* | 2/2008 | Kato | ...................... | F04D 27/00 361/695 |
| 7,676,280 B1* | 3/2010 | Bash | ................. | H05K 7/20836 700/17 |
| 7,894,191 B2* | 2/2011 | Tsuchiya | ............ | H05K 7/20836 361/679.48 |
| 8,090,476 B2* | 1/2012 | Dawson | ............. | G05D 23/1917 700/278 |
| 8,113,776 B2* | 2/2012 | June | ...................... | F04D 27/008 416/61 |
| 8,117,012 B2* | 2/2012 | Vinson | ..................... | G06F 1/20 703/1 |
| 8,412,357 B2* | 4/2013 | Seem | ................... | G05B 13/042 700/28 |
| 8,560,132 B2* | 10/2013 | Matteson | ........... | H05K 7/20836 361/679.48 |
| 8,712,597 B2* | 4/2014 | Rozzi | ................. | H05K 7/20209 361/679.48 |
| 8,751,057 B2* | 6/2014 | Tan | .................... | G05D 23/1919 700/278 |
| 8,826,893 B2* | 9/2014 | Marsh | ................. | F02B 29/0412 60/599 |
| 8,924,026 B2* | 12/2014 | Federspiel | ......... | H05K 7/20836 700/291 |
| 8,939,824 B1* | 1/2015 | Bash | .................... | F25D 17/045 62/178 |
| 9,188,355 B1* | 11/2015 | Allen | ...................... | F24F 11/77 |
| 9,291,358 B2* | 3/2016 | Federspiel | ......... | G05D 23/1934 |
| 9,317,045 B2* | 4/2016 | Federspiel | ............ | G05D 22/02 |
| 9,459,669 B2* | 10/2016 | Hrehor, Jr. | ........... | H01L 23/427 |
| 9,820,409 B1* | 11/2017 | Ross | .................. | H05K 7/20736 |
| 9,846,444 B1* | 12/2017 | Yang | ...................... | G06F 1/206 |
| 9,968,011 B2* | 5/2018 | Shabbir | ............. | H05K 7/20836 |
| 10,087,958 B2* | 10/2018 | McKernan | ............. | F15B 11/22 |
| 10,227,222 B2* | 3/2019 | Kendall | .................... | B66F 7/16 |
| 10,246,313 B2* | 4/2019 | Kendall | ................... | E04B 2/18 |
| 10,264,714 B1* | 4/2019 | Dolan | ................ | G05D 1/0274 |
| 10,315,853 B2* | 6/2019 | Nelson | ................ | B65G 41/008 |
| 10,317,105 B2* | 6/2019 | Hopkins | ................. | F24F 11/30 |
| 10,369,466 B2* | 8/2019 | Zalewski | ............ | A63F 13/424 |
| 10,371,395 B2* | 8/2019 | Rite | ......................... | F24F 11/62 |
| 10,379,552 B2* | 8/2019 | Lee | ......................... | G06F 1/206 |
| 10,452,109 B2* | 10/2019 | Woo | ..................... | G06F 1/203 |
| 10,591,173 B2* | 3/2020 | Denton | ................... | F24F 11/30 |
| 10,624,241 B1* | 4/2020 | Ross | ................. | H05K 7/20736 |
| 10,657,801 B2* | 5/2020 | Yusuf | ..................... | G06N 3/084 |
| 10,660,241 B2* | 5/2020 | Brunstetter | ........ | H05K 7/20836 |
| 10,735,835 B2* | 8/2020 | Balle | .................. | G06F 16/9014 |
| 10,771,870 B2* | 9/2020 | Balle | ................... | G02B 6/3882 |
| 10,804,057 B2* | 10/2020 | Ledbetter | ........... | H01H 11/0006 |
| 10,888,028 B2* | 1/2021 | Yang | ................. | H05K 7/20618 |
| 10,942,195 B1* | 3/2021 | Kom | .................. | H05K 7/20572 |
| 10,988,358 B2* | 4/2021 | Taylor | ................ | B66F 7/0666 |
| 11,023,048 B2* | 6/2021 | Chia-Chieh Sun | ... | G06F 1/1605 |
| 11,041,500 B2* | 6/2021 | Barron | ............... | H05K 7/20836 |
| 11,058,027 B2* | 7/2021 | Artman | ................ | G05B 19/042 |
| 11,076,509 B2* | 7/2021 | Alissa | ................ | H05K 7/20836 |
| 11,109,507 B2* | 8/2021 | Yu | ......................... | H01F 27/085 |
| 11,147,186 B2* | 10/2021 | North | ................ | H05K 7/20209 |
| 11,153,988 B1* | 10/2021 | Patel | ................ | H05K 7/20209 |
| 11,157,380 B2* | 10/2021 | Sethi | ...................... | G06N 3/02 |
| 11,188,039 B2* | 11/2021 | Murugesan | ............ | G05B 15/02 |
| 11,237,605 B2* | 2/2022 | Kom | .................... | F04D 25/12 |
| 11,243,502 B2* | 2/2022 | Saxena | .............. | G05B 13/0265 |
| 11,350,543 B2* | 5/2022 | Shabbir | .............. | H05K 7/20209 |
| 11,353,850 B2* | 6/2022 | Cella | .................... | G06N 3/0454 |
| 11,360,528 B2* | 6/2022 | Mishra | .................. | G06F 1/206 |
| 11,371,539 B2* | 6/2022 | Zwerenz | ................ | F15B 15/20 |
| 11,372,460 B2* | 6/2022 | Ping | ...................... | G05B 13/024 |
| 11,385,607 B2* | 7/2022 | Ahmed | .................... | F24F 11/32 |
| 2003/0069960 A1* | 4/2003 | Symons | ............. | H04L 41/0856 709/224 |
| 2006/0225481 A1* | 10/2006 | Kato | ....................... | F04D 27/00 73/1.01 |
| 2006/0262499 A1* | 11/2006 | Vinson | .................... | G06F 1/20 361/679.48 |
| 2008/0312888 A1* | 12/2008 | Vinson | .................... | G06F 1/20 703/2 |
| 2008/0313492 A1* | 12/2008 | Hansen | ............... | H05K 7/20836 361/679.48 |
| 2009/0116189 A1* | 5/2009 | Chang | ................ | H05K 7/20909 361/695 |
| 2009/0230240 A1* | 9/2009 | Osborne | ................... | B64C 9/34 244/87 |
| 2009/0257872 A1* | 10/2009 | June | ...................... | F04D 29/582 416/1 |
| 2011/0245976 A1* | 10/2011 | Thompson | ......... | H05K 7/20209 700/275 |
| 2013/0191676 A1* | 7/2013 | Mase | ........................ | G06F 1/28 713/340 |
| 2014/0141707 A1* | 5/2014 | Carlson | .............. | H05K 7/20736 454/184 |
| 2014/0337256 A1* | 11/2014 | Varadi | ..................... | G05B 13/04 706/12 |
| 2015/0030469 A1* | 1/2015 | Hopkins | ................. | F04D 25/166 417/3 |
| 2015/0060009 A1 | 3/2015 | Shelnutt et al. | | |
| 2015/0098180 A1* | 4/2015 | Berghe | ............... | H05K 7/20736 361/679.48 |
| 2015/0100165 A1* | 4/2015 | Federspiel | ......... | G05D 23/1934 700/276 |
| 2015/0345813 A1* | 12/2015 | Rite | ........................ | F24F 1/08 62/208 |
| 2016/0011607 A1* | 1/2016 | James | ........................ | H05K 7/20 700/300 |
| 2017/0082111 A1* | 3/2017 | Barron | .................. | G05B 15/02 |
| 2017/0097003 A1* | 4/2017 | Chen | ................ | H05K 7/20736 |
| 2017/0155354 A1* | 6/2017 | Mukai | ................. | H02P 23/0031 |
| 2017/0164526 A1* | 6/2017 | Govindarajan | ..... | H05K 7/20736 |
| 2018/0026906 A1* | 1/2018 | Balle | ........................ | H04L 49/35 709/226 |
| 2019/0042979 A1* | 2/2019 | Devulapalli | ........... | G06N 20/00 |
| 2019/0110379 A1* | 4/2019 | Cui | ..................... | H05K 7/20836 |
| 2019/0147364 A1* | 5/2019 | Alt | .......................... | G06N 20/10 706/12 |
| 2019/0187634 A1* | 6/2019 | Fan | .......................... | F24F 11/65 |
| 2019/0265764 A1* | 8/2019 | Ping | ..................... | G05B 13/026 |
| 2019/0265765 A1* | 8/2019 | Jahagirdar | ........... | G05B 19/054 |
| 2019/0364692 A1* | 11/2019 | Yu | .......................... | H01F 27/085 |
| 2020/0341436 A1* | 10/2020 | Saxena | ............... | G05B 13/0265 |
| 2020/0379529 A1* | 12/2020 | Le Goff | ................ | G06K 9/6256 |
| 2021/0028983 A1* | 1/2021 | Balakrishnan | ........ | H04L 43/065 |
| 2021/0033097 A1* | 2/2021 | Wenger | ................... | F04D 25/08 |
| 2021/0034021 A1* | 2/2021 | Wenger | ................... | G06N 20/00 |
| 2021/0068302 A1* | 3/2021 | North | .................. | G06F 9/5055 |
| 2021/0104788 A1* | 4/2021 | Shao | .................. | H01M 10/613 |
| 2021/0124378 A1* | 4/2021 | Remis | ....................... | G06F 1/20 |
| 2021/0149465 A1* | 5/2021 | Hiltner | .................... | G06F 1/206 |
| 2021/0247134 A1* | 8/2021 | Gray | ................... | H04L 12/2816 |
| 2021/0318018 A1* | 10/2021 | Kitagawa | ................ | F24F 11/64 |
| 2021/0360833 A1* | 11/2021 | Alissa | ................ | H05K 7/20745 |
| 2021/0398155 A1* | 12/2021 | Shimo | ..................... | H02J 3/003 |

(56) References Cited

U.S. PATENT DOCUMENTS

| | | | |
|---|---|---|---|
| 2022/0004475 A1* | 1/2022 | Benoit | G06F 11/3006 |
| 2022/0011835 A1* | 1/2022 | Heydari | G05B 19/02 |
| 2022/0117122 A1* | 4/2022 | Kalantarian | H05K 7/20736 |
| 2022/0142008 A1* | 5/2022 | Patel | H05K 7/20736 361/679.48 |
| 2022/0146128 A1* | 5/2022 | Bassa | G05B 13/028 |
| 2022/0171379 A1* | 6/2022 | Zhou | H05B 6/642 |
| 2022/0201900 A1* | 6/2022 | Ma | H05K 7/20736 |
| 2022/0205661 A1* | 6/2022 | Fujita | F24F 5/00 |
| 2022/0221916 A1* | 7/2022 | Eiland | G06F 1/20 |
| 2022/0225545 A1* | 7/2022 | Heydari | H05K 7/20736 |
| 2022/0237570 A1* | 7/2022 | Sethi | G07C 3/06 |
| 2022/0240365 A1* | 7/2022 | Liu | F28F 1/12 |

OTHER PUBLICATIONS

Li et al., "ThermoCast: A Cyber-Physical Forecasting Model for Data Centers," ACM, 2011,Copyright 2011 ACM 978-1-4503-0813-7/11/08, 9 pages, https://www.microsoft.com/en-us/research/wp-content/uploads/2016/02/p1370-li.pdf.

Nelson, "Development of an Experimentally-Validated Compact Model of a Server Rack," Thesis, Dec. 2017, 167 pages, https://smartech.gatech.edu/bitstream/handle/1853/19726/Nelson_Graham_M_200512_mast.pdf.

"Fin (extended surface)," Wikipedia the Free Encyclopedia, Printed Jan. 10, 2020, 6 pages https://en.wikipedia.org/wiki/Fin_(extended_surface).

Shah, "Extended Surface Heat Transfer," Thermopedia, Article last modified: Feb. 14, 2011, Copyright 2010-2020, 1 page, http://thermopedia.com/content/750/.

Unknown, "18.2 Heat Transfer From a Fin," Printed Jan. 10, 2020, 6 pages https://web.mit.edu/16.unified/www/SPRING/propulsion/notes/node128.html.

Woods, "Cooling the Data Center," ACM Queue, Power Management, vol. 8, Issue 3, Mar. 10, 2010, 10 pages, https://queue.acm.org/detail.cfm?id=1737963.

* cited by examiner

INTELLIGENTLY DEPLOYED COOLING FINS

BACKGROUND

The present disclosure relates to server cooling systems, and more specifically, to cooling fins for server racks and cabinets.

Server racks and cabinets typically contain a large amount of server modules that each produce heat while running. Some servers contain one or more central processing units (sometimes referred to herein as "CPUs"), graphics processor units (sometimes referred to herein as "GPUs"), memory modules, power supply modules, and other components, all of which may produce heat. Keeping these components below a certain temperature is often required for the servers to operate effectively.

Server modules often use cooling fins in order to keep the components within the module at an appropriate temperature. Cooling fins operate by spreading the heat from one or more components (or one or more server modules) over a large surface area (i.e., the surface area of the fins). When air flows over those fins, the heat from the module components passes from the fins to the air, allowing the module components to stay cool.

SUMMARY

Some embodiments of the present disclosure can be illustrated as a method of customizing the cooling of a first heat-producing system. The method comprises selecting a first set of cooling fins with a first deployment level. The first set of cooling fins may be configured to cool a first heat-producing element. The method also comprises analyzing environmental data for an environment associated with the first set of cooling fins. The method also comprises quantifying, based on the analysis, a cooling benefit of the first deployment level. The method also comprises quantifying, based on the analysis, an airflow detriment of the first deployment level. The method also comprises determining that the airflow detriment outweighs the cooling benefit. Finally, the method comprises reducing the deployment level based on the determination, resulting in a reduced deployment level.

Some embodiments of the present disclosure can also be illustrated as a computer program product that comprises a computer readable storage medium having program instructions embodied therewith, the program instructions executable by a computer to cause the computer to perform the above-described method.

Some embodiments of the present disclosure can also be illustrated as a heat-producing system. The heat-producing system comprises a first heat-producing element that is configured to be cooled by a first set of cooling fins. The first set of cooling fins has a first deployment level. The heat-producing system also comprises a second heat-producing element that is configured to be cooled by a second set of cooling fins. The heat-producing system also comprises a cooling management system that comprises a processor and a memory in communication with the processor, the memory containing program instructions that, when executed by the processor, are configured to cause the processor to perform a method. The method comprises quantifying a cooling benefit of the first set of cooling fins on the first heat-producing element. The method also comprises quantifying an airflow detriment of the first set of cooling fins on the second heat-producing element. The method also comprises determining that the cooling benefit outweighs the airflow detriment. The method also comprises determining that an increased deployment level is implicated. Finally, the method comprises increasing the deployment level, resulting in an increased deployment level.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
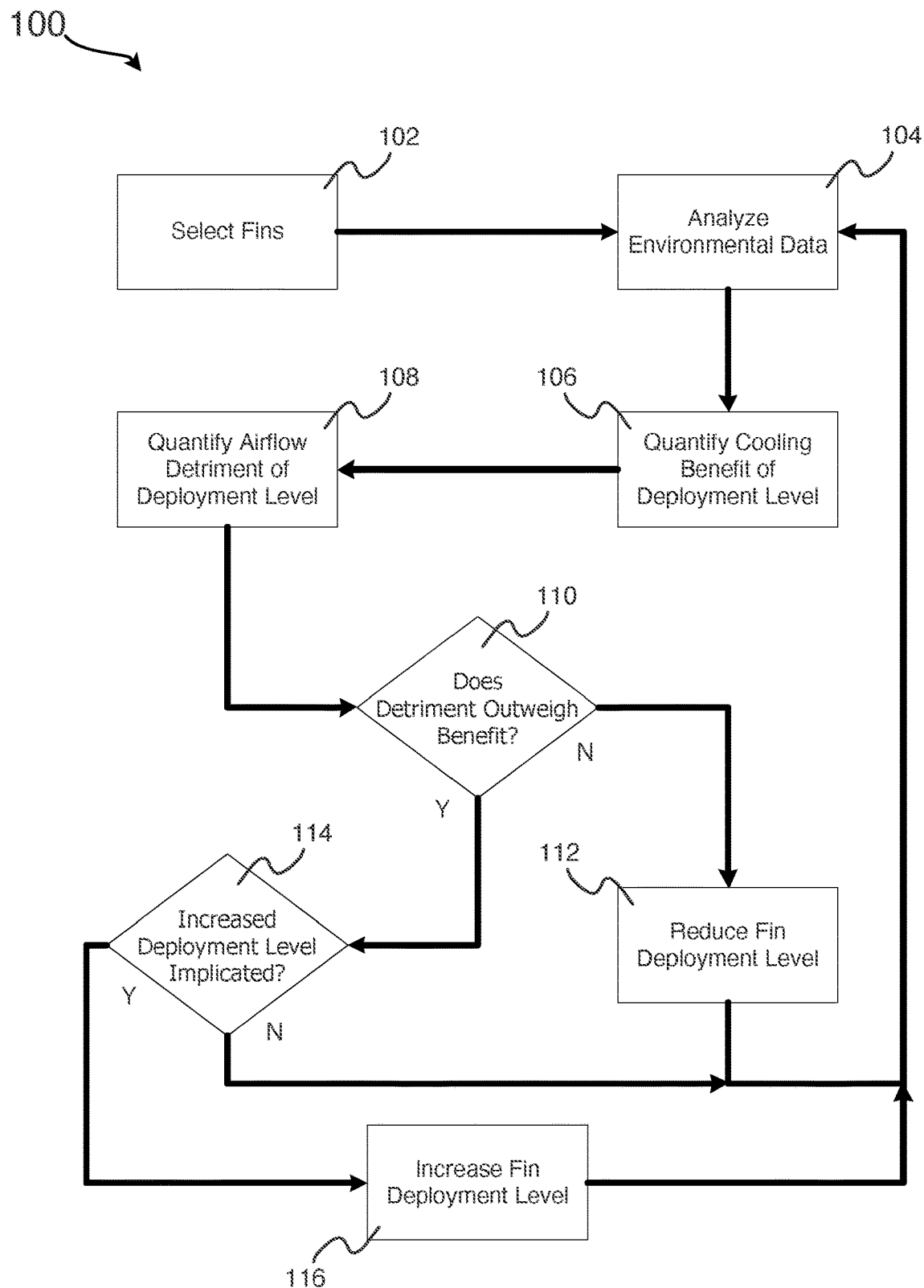
FIG. 1 depicts a method of managing the deployment level of a set of fins in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to server cooling systems, more particular aspects relate to cooling fins for server racks and cabinets. While the present disclosure is not necessarily limited to such applications, various aspects of the disclosure may be appreciated through a discussion of various examples using this context.

A typical server module may include one or more central processing units (sometimes referred to herein as "CPUs"), graphics processor units (sometimes referred to herein as "GPUs"), memory modules, power supply modules, and other components. Each of these components produces heat under normal operation. As that heat is produced, the environment around the component tends to heat up. If these components are allowed to operate without a system in place to manage the heat that they produce, the environment may become too hot for the components to function effectively.

Some use cases require many server modules running together for long periods of time. In some instances many server modules are combined together in a larger container called a server rack. In typical server racks, each server module are enclosed in their own housing, which is then inserted into the rack with the other server modules (each in their own housing) in the rack. At certain times several server modules may be operating simultaneously, which could cause a significant amount of heat produced in the rack.

Further, some use cases combine several server racks together groups that may be organized into rows or in server cabinets. Server cabinets often take the form of rows of server racks that are at least partially separated from the surrounding environment. For example, a typical server cabinet may take the form of two rows of servers with an isle between them. The isle between the rows may be separated from the surrounding environment by a ceiling above the isle, doors on either end of the isle, and the rows of servers on either side of the isle.

Because the above use cases often include many server modules running simultaneously, effectively removing the generated heat from the server modules and, subsequently, the surrounding environment, can be a challenge. Typical use cases utilize organized air flow to constantly move cool air into the environment, over the heat generating server modules in the racks, rows, and/or cabinets, and out of the environment once the heat from the server modules has transferred to the cool air. Once the cool air passes over (or through) a server module and is heated by the module, it may be referred to as "exhaust air" or "server exhaust."

Rows of server racks typically are oriented such that the modules of the server racks in a row attempt to direct their exhaust into one "exhaust area." In typical use cases, two server rows may utilize the isle between them as a common exhaust area. In server cabinets, this common exhaust area may therefore be separated from the surrounding environment, which may facilitate removing the hot air from the exhaust area before it is able to mix with the cooler air that is being directed to cool the server modules.

However, even with the above organized air-cooling efforts, server modules sometimes produce enough heat that passing air over the bare module housings is sometimes insufficient to keep the components in that module (or other modules in the rack, row, or cabinet) from overheating. For this reason, server modules often attach cooling fins to their housings near heat-generating components to serve as a conduit for the heat between the components and the cool air passing over the module housing. Once the heat produced by the module components passes into the cooling fins, it can spread over a far greater surface area than the module housing alone, greatly increasing the ability of the heat to transfer from the module to the cool air passing over the module.

While there are sometimes diminishing returns, in a typical use case the cooling ability of a server module would theoretically increase as the total surface area of cooling fins attached to that module increases. However, there are practical limitations to this theoretical increase. To begin, cooling fins attached to a module housing are far less effective if the heat produced by a module component does not have an efficient route to transfer heat from the module, through the housing, and to the fins. Thus, cooling fins are most effective when they are placed on the module housing in very close proximity to the heat-producing component.

Further, because cooling fins rely on a transfer of heat to cool air surrounding the fins, cooling fins are most effective if they are surrounded by a continuous supply of cool air. For this reason, cooling fins require high amounts of airflow passing over the fins to be most effective.

Unfortunately, these two practical limitations can work together to create another challenge with cooling server modules (whether individually or grouped in racks, rows, or cabinets). While cooling fins are often necessary to transfer heat from module components to the cool air flowing over the module housing, those cooling fins also can disrupt that airflow. Because a flow of air must shift slightly to move through a set of cooling fins when the air encounters the fins, turbulence can be created and the direction of the airflow is not as "clean" after passing through the set of fins as it was before encountering the fins. In other words, whereas the air may largely be moving in the same direction and the same speed before encountering the cooling fins, the air may be moving in many different directions and different speeds (typically slower) after the leaving the set of fins. Combined with the fact that the air may be heated by the cooling fins (and thus further heat transfer to the air may be less efficient), this can make the airflow far less effective at cooling subsequent sets of fins that are associated with other components in the module, rack, or row/cabinet.

However, as discussed, cooling fins rely on an efficient heat-transfer route from the components they are cooling, and thus their position on the module housing is often restricted by the location of the heat-producing components in the module. In many situations, unfortunately, this results in components that are placed near each other to have cooling fins that are near each other. For this reason, the airflow that cools a particular set of cooling fins for one component (or module) may be required to pass through another set of cooling fins first. For the reasons discussed above, this can result in that airflow being disturbed before it gets to the particular set of cooling fins, which can in turn reduce the volume of air that passes over the cooling fins and cause the air to move over the cooling fins to move in inefficient directions.

This relationship often results in a complicated cooling tradeoff between the benefits derived by a particular component or module (or even set of modules) being sufficiently cooled by high-surface-area cooling fins and the airflow detriments that those high-surface-area cooling fins create for subsequent sets of cooling fins. In other words, while a component, module, rack, or row/cabinet benefits from having a high total surface area of cooling fins, it also can suffer airflow detriments from those cooling fins. In some instances, the cooling benefits outweigh the airflow detriments. However, in other instances, the airflow detriments may outweigh the cooling benefits, and a set of cooling fins may be doing more harm than good to the overall system as a result.

When a component, server module, or set of server modules is running at high capacity (and therefore producing a high amount of heat), the cooling benefit of high-surface-area fins often outweighs the airflow detriments that those fins cause. If, on the other hand, the component, server module, or set of server modules is running at low capacity (or is off), less heat is likely to be produced. In these circumstances, high-surface-area cooling fins may be unnecessary to cool the component, server module, or set of server modules, and therefore the cooling benefit of the high-surface-area cooling fins may be outweighed by the airflow detriments that those fins cause. In other words, the module as a whole or the overall system may end up running hotter because of the presence of cooling fins that are not resulting in a significant cooling benefit.

This cooling tradeoff can be made worse in situations in which an element that is being cooled by a set of cooling fins, sometimes referred to herein as a heat-producing element (e.g., a module component, module or set of modules) typically produces a small or moderate amount of heat, but also occasionally produces high amounts of heat in situations in which the performance of the heat-producing element (and thus the cooling of that element) is important. To effectively cool this heat-producing element in the high-heat situations, incorporating high-surface-area cooling fins in close proximity to the heat-producing element may be necessary. However, because that heat-producing element does not produce a high amount heat in typical operation, those high-surface-area cooling fins may typically net negative effect on overall system cooling because of the airflow disturbances caused by the fins.

For this reason, systems such as server cabinets with a large amount of servers that can have performance spikes above their normal operation may experience a significant amount of airflow disturbances without a corresponding cooling benefit during a large percentage of the operation of the system. In other words, those systems may, in typical operation, be cooled inefficiently due to the airflow impacts of cooling fins with surface areas that are higher than necessary for typical operational conditions.

To overcome some of the above cooling challenges, some embodiments of the present disclosure incorporate cooling fins that can be deployed (e.g., expanded) and retracted depending upon a comparison between the immediate cooling benefits of the fins and the downstream airflow detriment of the fins. For example, the cooling system for a server cabinet may incorporate several sets of fins that can be independently expanded and retracted. A cooling management system may determine, for a particular set of fins, whether to expand those fins or retract those fins based on a comparison between the amount that the fins benefit the heating elements to which the fins are connected and the amount that the airflow disturbances caused by the fins is negatively impacting other heating elements.

In some embodiments, the deployment level of a set of fins may be reduced by a cooling management system if the cooling benefit provided by the fins is outweighed by the airflow detriment caused by the fins. On the other hand, if the cooling benefit provided by the fins outweighs the airflow detriment caused by the fins, the cooling management system may maintain the current deployment level of the fins. In some embodiments, the cooling management system may also determine whether further cooling benefit would result from increasing the deployment level of the fins, and may increase (or not increase) the deployment level of the fins as a result.

In some embodiments, increasing the deployment level of a set of fins may involve expanding those fins in a direction that is perpendicular to the mounting surface (e.g., the housing of a server module). For example, the cooling fins may take the form of a telescoping fin mechanism in which a central fin member can be pushed out of a cavity by, for example, a piston, spring, or hydraulic pressure. When the central fin member is fully expanded, the cooling fin may have a large surface area. However, when the central fin member is fully inserted into the cavity (for example, by retracting the piston, relaxing the spring, or reducing the hydraulic pressure), the cooling fin may have a significantly smaller surface area.

In some embodiments, increasing the deployment level of a set of fins may involve pivoting those fins from an angle that is less perpendicular to a mounting surface to an angle that is more perpendicular to the mounting surface. For example, when a set of fins is not providing cooling benefit, the fins in the set may pivot out of the way, partially or completely clearing a bath between a cool air intake and the cooling fins that are placed after the pivoted fins. While this may not decrease the fin surface area, it may reduce the extent to which that surface area disrupts the airflow for other cooling fins in the system.

In some embodiments of the present disclosure, a cooling management system may collect environmental data to use when determining whether a deployment level for a set of cooling fins should be reduced or increased. For example, the cooling management system may have access to component-temperature data recorded by, such as, for example, a temperature probe on a central-processing-unit die or a memory module. The system may also have temperature probes attached to a module enclosure, placed throughout a rack or row/cabinet that record the temperature of the surrounding air or of the solid material (e.g., a rack chassis, a module housing) to which the probes are attached. The cooling management system may also have access to cameras that are able to sense the temperature of the air or objects at which those objects are facing (for example these cameras may incorporate a laser thermometer or infra-red imaging). Further, the cooling management system may also have access to sensors that are able to detect the air flow around a server module, within a rack, or within a row/cabinet. For example, particularly turbulent airflow near cooling fins may be identified as concerning.

In some embodiments, the cooling management system may also have access to information about current or upcoming workloads for the servers (or components therein) in a server module, rack, or row/cabinet. If the cooling management system has information that identifies the sets of fins that cool those servers (or components therein), the cooling management system may be able to respond accordingly. This response may include, for example, increasing the deployment level of the fins that cool the identified heat-producing elements, decrease the deployment level of fins that disrupt airflow near the identified heat-producing elements, or prepare to do one of these or other actions.

For example, the cooling management system may receive information from a server that identifies the percentage capacity at which its central processing unit (sometimes referred to herein as a "CPU") is operating. From this information, the cooling management system may extrapolate the amount of heat the CPU (or the server module itself) is likely to generate in the near future, if it is not doing so already. If the cooling management system is aware of the set of fins that cools the server's CPU, the cooling management system may prepare to increase the deployment level of that set of fins. The cooling management system may also receive information from a server that informs the cooling management system that its memory is currently in the process of receiving a very large set of data from storage, and thus the cooling management system may infer that the memory of the server is likely to produce a lot of heat soon, if it is not doing so already. Further, the cooling management system may receive information from a server informing the cooling management system that the server will be starting a particular job in an amount of time (e.g., two hours). The server may further inform the cooling management system that this job will require very high performance from the server's memory and graphics processing unit, which may imply that the memory and graphics processing unit may be expected to produce a high amount of heat when the particular job starts.

As discussed, a cooling management system may receive multiple types of information from multiple sources, which that cooling management system may analyze to estimate, for a particular set of fins, whether the cooling benefit of the fins is greater than the airflow detriment. However, the process of performing this estimation may, in some embodiments, be a very complicated process. In order for the estimation to be accurate in some embodiments, the cooling management system may require access to the large amount of data discussed above, and may be required to analyze that data quickly. In these and some other embodiments, the amount of information may be high enough that some types of computer systems may not be sufficient for performing the estimation in real time.

For this reason, some embodiments of the present disclosure utilize a machine-learning system to ingest the information available to the cooling management system, analyze the information, and estimate whether the cooling benefit of a particular set of fins is greater than the airflow detriment. For example, a cooling management system may either include or have access to a neural network that is trained to accept, as an input, the temperature of server-module components (for example, as reported by the components), the temperature of various locations on a server-module housing (for example, as recorded by an infrared camera), the temperature of various locations on a server rack (for example, as recorded by a laser thermometer), the temperature of the air in various locations of a server cabinet or row of servers (for example, as reported by temperature probes), airflow in various locations of a row of servers or the surrounding environment (for example, as reported by a camera capable of detecting airflow direction), current and future workloads of a group of servers, a single server, or components of a server, and timestamps related to all of the above information. The neural network may then analyze some or all of this information and estimate, for example, the likelihood that the cooling benefit for a set of fins outweighs the airflow detriment caused by the fins.

For example, a machine-learning system may have access to historical data related to the current server, set of servers, or datacenter or other servers, sets of servers, or datacenters. The machine-learning system may have been trained to analyze patterns in that historical data and associate those patterns with a conclusion that a set of fins was deployed at an inefficient level. For example, the machine-learning system may have been presented with a dataset related to several situations in which the deployment level for a set of fins with particular similar characteristics (i.e., similar patterns in the historical data for those fins) was reduced, and the overall cooling efficiency of the associated server or sets of servers increased. This may train the machine-learning system to associate those particular similar characteristics with a likelihood that the set of fins is over deployed. When such a machine-learning system is utilized by a cooling management system in real time, the machine-learning system may attempt to identify those particular similar characteristics (among other data patterns) to identify sets of fins whose deployment levels should be decreased.

FIG. 1 illustrates a method 100 of adjusting the deployment level of a set of fins to optimize the relationship between the cooling benefit and incidental airflow detriment of the fins, in accordance with embodiments of the present disclosure. Method 100 may be performed by a cooling management system that is responsible for optimizing the cooling of a heat-producing system, such as a server module, a set of server modules, a server rack, a row of server racks, a server cabinet, or a group of rows or cabinets in a data center. In some embodiments the cooling management system may take the form of standard computer (e.g., a desktop or laptop computer), a server, a machine-learning system (e.g., a neural network or set of neural networks), or even the server module (or one of the server modules) of the heat-producing system that the cooling management system is managing.

In block 102, the fins to be optimized are selected. In some embodiments, for example, the cooling management system may group the cooling fins of the heat-producing system based on the heat-producing elements that those cooling fins are designed to cool. For example, the cooling management system may select the cooling fins that are designed to cool a CPU of a server module, all the cooling fins that are designed to cool a server module, all the cooling fins that are designed to cool a set of server modules (for example, the heat from several server modules is redirected to shared set of fins using a water-cooling system), a subset of any of those groups (for example, half the fins that are designed to cool a CPU), or others. In some embodiments the fins of the heat-producing system may be placed into pre-determined groups, and block 102 may include selecting one of those groups. In other embodiments block 102 may include the cooling management system forming a group of fins for each iteration of block 102.

After the fins to be optimized are selected in block 102, the cooling management system analyzes the available environmental data in block 104. This environmental data may include any combination of the environmental data discussed within this disclosure. For example, the cooling management system may analyze the component temperatures reported by the heat-producing elements (e.g., the reported temperature of one or more CPU dies), the temperatures of surfaces in the area surrounding the fins, the air temperatures in various locations within the heat-producing system, information regarding the present and future activity of heat-producing elements in the heat-producing system, airflow measurements, and others. In some embodiments this analysis may be performed by a machine-learning system (such as one or more classifier-type neural networks) that has access to historical data of the heat-producing system, other heat-producing systems, or both.

In some embodiments, the analysis performed in block 104 may include an estimation of the requires cooling-fin surface area necessary to effectively cool the heat-producing elements that fins selected in block 102 are designed to cool. In some embodiments, the analysis performed in block 104 may also include an estimation of the cooling requirements of other heat-producing elements that may be affected by the selected fins (or whose cooling fins may be affected by the selected fins). In some embodiments, the analysis performed in block 104 may also include an estimation of the downstream airflow effects of the selected fins.

In block 106, the cooling management system may, based on the analysis in block 104, quantify the cooling benefit of the current deployment level of the selected fins. In some embodiments, for example, this may take the form of estimating the surface area that would be necessary to cool the heat-producing elements that the selected fins are designed to cool under the current conditions. This estimation may take into account, for example, the activity level of the heat-producing elements, quality of airflow passing through the selected fins, and air temperature passing through the selected fins. This estimated surface area may then be compared with the currently deployed surface area. In some embodiments, this quantification may be weighted by several factors. For example, cooling a server module that is performing low-value tasks may not be determined to be as beneficial as cooling a server module that is performing a very valuable task. Further, cooling two processors may be determined to be more beneficial than cooling one processor. In some embodiments, the cooling management system may also consider the diminishing returns of the cooling benefit of the selected fins at their current deployment level. For example, in some instances a set of heat-producing elements may be experiencing a very high benefit from the current surface area of the selected cooling fins. However, because of diminishing returns of cooling benefit above a certain surface area, the benefit may not change significantly if the surface area of the selected fins were reduced. In this situation, the value applied to the cooling benefit may be reduced.

In block 108, the cooling management system may, based on the analysis in block 104, quantify the airflow detriment of the current deployment level of the selected fins. In some embodiments, for example, this may be as simple as multiplying the deployment level by a pre-determined constant (e.g., 35% deployment multiplied by 200 equals an airflow-detriment value of 70). In some embodiments, this may also consider the incidental effects on downstream airflow of the selected fins (at the current deployment level) and estimate whether downstream cooling fins would require less surface area to keep their own heat-producing elements cool (or the extent to which they would require less surface area) if those incidental effects did not exist. In some embodiments, block 108 may also consider the performance of the heat-producing elements associated with downstream fins. For example, an extremely high disruption to downstream airflow may have no actual detriment to downstream heat-producing elements if all downstream heat-producing elements are were all shut down for maintenance. On the other hand, a moderate disruption to downstream airflow may have a significant detriment on downstream heat-producing elements that are operating at 100% capacity and therefore requiring very efficient cooling. In some embodiments, the determination may also take into account the number of downstream heat-producing elements that are affected by the selected fins. In some embodiments, blocks 108 and 106 could occur in an order opposite of the order shown, or simultaneously.

In block 110, the cooling management system determines whether the airflow detriment quantified at block 108 outweighs the cooling benefit quantified at block 106. In some embodiments this may take the form of subtracting an airflow-detriment value (or a cooling-benefit value) from a cooling-benefit value (or an airflow-detriment value). In some embodiments, this determination may be weighted based on the importance of the workloads being performed by the heat-producing elements being cooled by the selected fins and the workloads being performed by the heat-producing elements being cooled by the fins impacted by the airflow detriment. For example, a moderate cooling benefit for a server module performing very valuable workloads may outweigh a high airflow detriment of several downstream servers that are performing low-value tasks.

If the cooling management system determines, in block 110, that the airflow detriment does outweigh the cooling benefit, the deployment level of the selected fins is reduced in block 112. In some embodiments, for example, the cooling management system may completely minimize the fin deployment level (e.g., completely collapse the selected fins or completely pivot the selected fins out of the incoming airflow). In other embodiments, the cooling management system may only partially reduce the fin deployment level.

In some embodiments, for example, the amount by which the cooling management system reduces the fin deployment level may depend on the extent to which the airflow detriment outweighed the cooling benefit in block 110 (for example, greater discrepancies between detriment and benefit may encourage greater reduction of fin deployment level). In some embodiments, the cooling management system may estimate the optimum fin deployment level that would maximize the efficiency of the heat-producing system and reduce to that level. After the deployment level of the selected fins is reduced, the cooling management system may return to block 104 and analyze the environment surrounding the fins with the newly reduced fin deployment level and repeat method 100 as necessary.

If, on the other hand, the cooling management system determines, in block 110, that the airflow detriment does not outweigh the cooling benefit, the cooling management system may determine whether an increase of the deployment level of the selected fins is implicated. For example, in embodiments in which the cooling benefit significantly outweighs the airflow detriment, the cooling management system may determine whether the heat-producing elements associated with the selected fins may benefit from more fin surface area.

If the cooling management system determines, in block 114, that further increase to the deployment level of the selected fins is unnecessary, the cooling management system may return to block 104, at which point the cooling management system may repeat the remainder of method 100. If, on the other hand, the cooling management system determines that further deployment level of the selected fins may increase the cooling benefit of the heat-producing elements (for example, if the performance of the heat-producing elements would be increased), the cooling management system may increase the fin deployment level in block 116. Similar to block 112, block 116 may, in some embodiments, cause an absolute increase (in other words, the fins may be fully deployed). In other embodiments, block 116 may cause a partial increase in deployment level. For example, the cooling management system may attempt to determine a deployment level for the selected fins that would optimize cooling efficiency of the heat-producing system and increase the deployment level accordingly. After the deployment level of the selected fins is increased, the cooling management system may return to block 104 and analyze the environment surrounding the fins with the newly increased fin deployment level and repeat method 100 as necessary.

In some embodiments, a cooling management system may continually perform loops of method 100 for each group of fins in a heat-producing system. In other embodiments, however, method 100 may only be performed when the cooling management system detects that airflow problems or temperature problems above a certain threshold are present in the heat producing system. For example, a cooling management system may monitor the environmental data of the heat-producing system and perform method 100 when the cooling management system detects a temperature on a set of cooling fins above a certain pre-determined threshold (e.g., 80 degrees Celsius) or when it detects airflow below a certain speed, above a certain level of turbulence, or an area of "dead air" (i.e., air that is not moving towards the exit of the heat-producing system). In these embodiments, the cooling management system may perform iterations of method 100 until the condition that originally triggered method 100 is remedied.

To ease in understanding, FIGS. 2A through 2D illustrate a heat-producing system 200 with a set of cooling fins 202 that are retracted due to detrimental downstream airflow effects. As described, heat-producing system 200 takes the form of a server module with at least two heat-producing elements 204 and 206. Heat producing elements 204 and 206 may take the form of components of heat-producing system 200, such as CPUs, GPUs, memory modules, power supplies, and others. Heat-producing elements 204 and 206 are each located within server module housing 208, and are therefore illustrated with a dotted line, indicating that they would not actually be visible in the views presented by FIGS. 2A through 2D.

Heat-producing element 204 transfers heat to set of cooling fins 202 (e.g., though a pedestal attached to a server die or a heatsink attached to a heat-spreader lid), whereas heat-producing element 206 transfers heat to set of cooling fins 210. Cooling fins 202 and 210 are illustrated as telescoping cooling fins. The top, striped portion of cooling fins 202 and 210 may be capable of retracting into the lower, shaded portion of cooling fins 202 and 210.

Figure 2A:
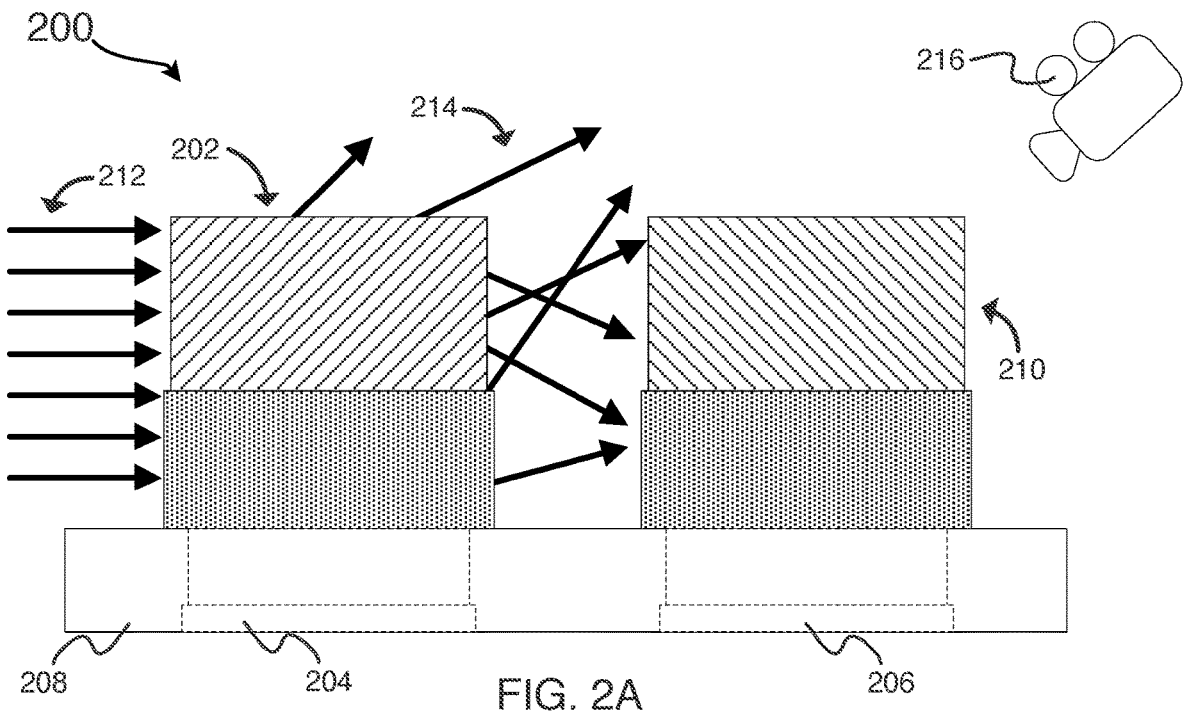
FIG. 2A depicts a side view of a set of extendable fins in an extended configuration.

Airflow vectors 212 represent the direction of a flow of air as the air encounters set of cooling fins 202. As illustrated in FIG. 2A, airflow vectors 212 are relatively parallel to each other and to the main dimension of cooling fins 202, which may cause the airflow associated with airflow vectors 212 to be efficient at cooling fins 202. However, cooling fins 202 may disrupt the airflow as the airflow passes through the cooling fins. For this reason, airflow vectors 214, which represent the airflow upon exiting cooling fins 202, are illustrated as not parallel to each other or the main dimension of cooling fins 210. For this reason, the disruptions that cooling fins 202 are causing to the airflow passing through heat-producing system 200 may have a negative effect on that airflow's ability to effectively cool cooling fins 210.

Finally, sensors 216 may represent a set of sensors that are configured to monitor the environmental conditions of heat-producing system 200 and surrounding heat-producing system 200. For example, sensors 216 may include an airflow sensor that is configured to monitor airflow vectors 212 and 214 and an infrared camera that is configured to monitor the surface temperatures of module housing 208, cooling fins 202, and cooling fins 210.

Figure 2B:
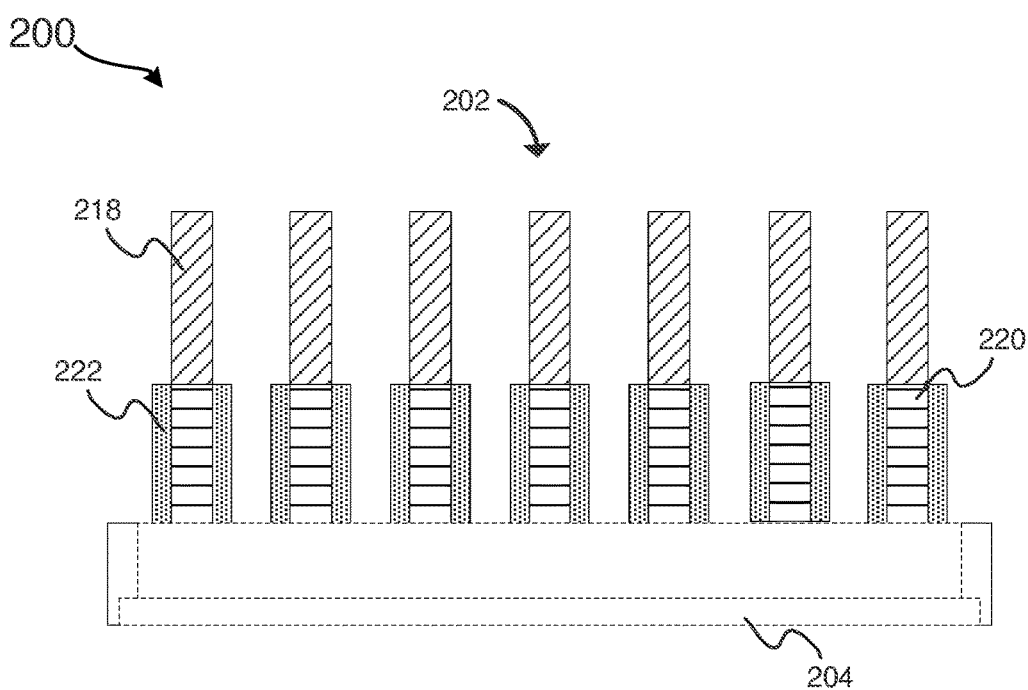
FIG. 2B depicts a front view of a set of extendable fins in an extended configuration.

FIG. 2B illustrates a front view of the heat-producing system 200. In other words, the view presented in FIG. 2B would be from the perspective of the airflow before it entered cooling fins 202. In other words, if a fan were causing in the airflow represented by airflow vectors 212, FIG. 2B may represent the view of that fan.

FIG. 2B depicts cooling fins 202, which, from the perspective illustrated in FIG. 2B, are blocking cooling fins 210. Cooling fins 202 are composed of several sections: retractable portion 218, cavity 220, and cavity walls 222. Cavity 220 may contain a hydraulic fluid that, when pressurized, causes retractable portion 218 to expand (as illustrated in FIGS. 2A and 2B). Cavity 220 may also comprise a piston or a spring that is capable of forcing retractable portion 218. In some embodiments, cavity 220 may be fluid filled to increase the ability of heat to flow from hate-producing element 204 through cavity 220 and into retractable portion 218. In some embodiments, cavity walls 222 and retractable portion 218 may overlap, causing heat to flow from cavity walls 222 to retractable portion 218.

Figure 2C:
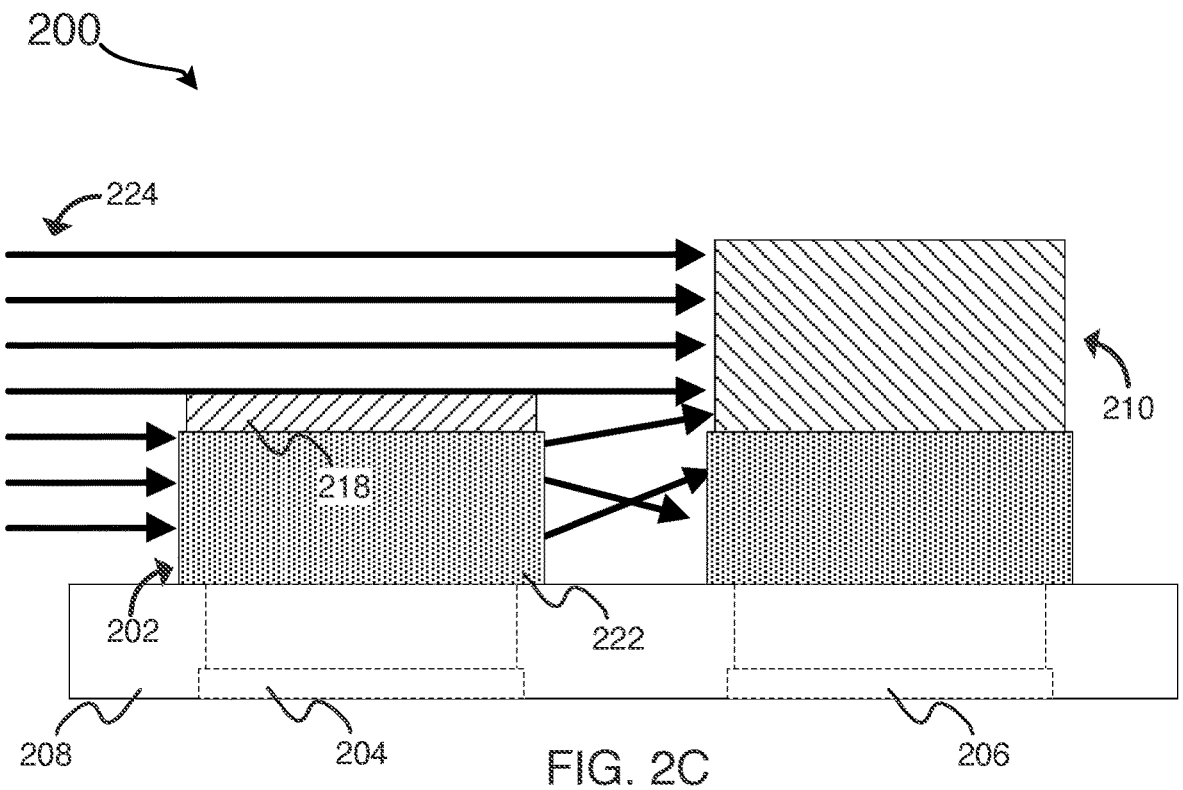
FIG. 2C depicts a side view of a set of extendable fins in a retracted configuration.

FIG. 2C illustrates the side view of heat-producing system 200 after a cooling management system has reduced the deployment level of cooling fins 202. In other words, FIG. 2C illustrates cooling fins 202 after retractable portion 218 has been retracted into cavity 220 (not visible in FIG. 2C). The cooling system may have reduced the deployment level of cooling fins 202, for example, because it determined that the cooling benefit that cooling fins 202 were providing to heat-producing element 204 was outweighed by detriment of the airflow disruption that cooling fins 202 were causing for cooling fins 210. The effects of this deployment reduction are apparent in airflow vectors 224, which illustrate that the airflow reaching cooling fins 210 is significantly more direct than the airflow reaching cooling fins 210 in FIG. 2A. In some use cases, this may result in significantly more efficient cooling of cooling fins 210, which may in turn result in higher performance of heat-producing element 206.

Figure 2D:
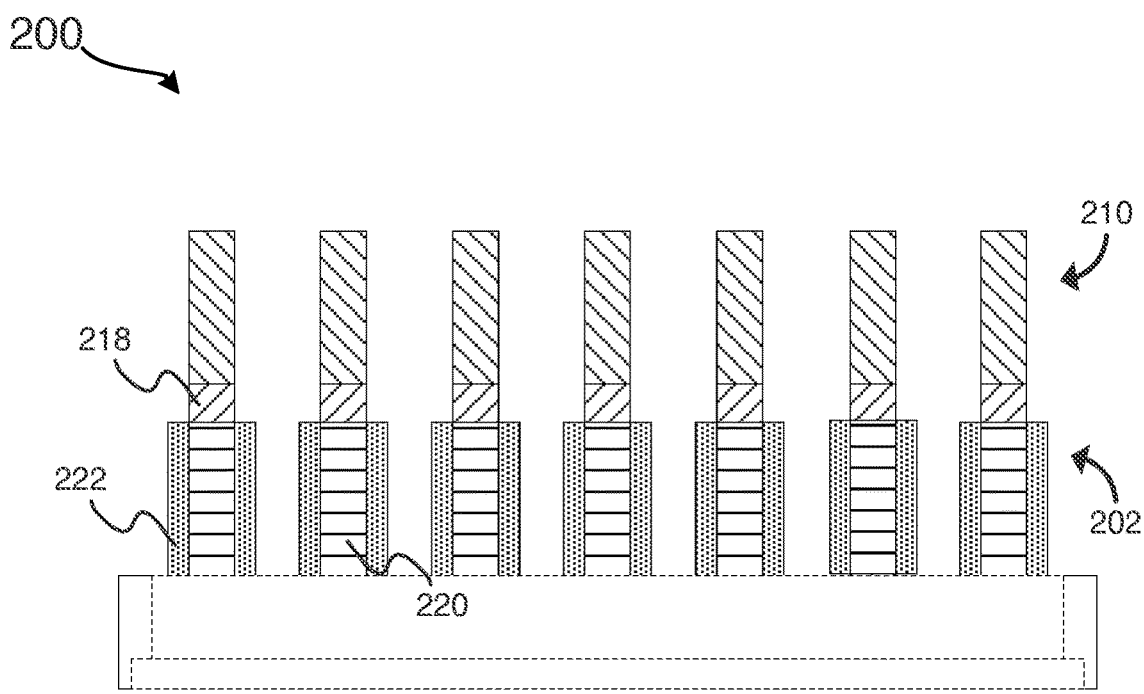
FIG. 2D depicts a front view of a set of extendable fins in a retracted configuration.

FIG. 2D illustrates the front view of the heat-producing system 200 after the deployment level of cooling fins 202 is reduced. As depicted, retractable portions 218 of cooling fins 202 have largely retracted into cavity 220. Behind cooling fins 202 and above retractable portions 218, cooling fins 210 are now visible. In some instances, these visible portions of cooling fins 210 may not have airflow that is completely unobstructed by cooling fins 202. This may significantly decrease the airflow detriment of cooling fins 202, and in turn increase the cooling efficiency of cooling fins 210, and the overall cooling efficiency of heat-producing system 200. Further, in some instances heat-producing element 206 (not depicted in FIG. 2D) may be capable of operating at a higher capacity than before the deployment level of cooling fins 202 was reduced.

It is noteworthy that FIGS. 2A through 2D are intended to be an abstract representation of a heat-producing system and cooling fins. The elements of FIGS. 2A through 2D are presented for the sake of reader understanding, rather than technical precision or accuracy. For example, the dimensions of the elements of FIGS. 2A through 2D are not necessarily meant to be to scale. Further, the number or size of elements in FIGS. 2A through 2D may differ from that shown. For example, while cooling fins 202 and 210 are illustrated as containing seven cooling fins, in some use cases cooling fins 202 and 210 may each contain many more cooling fins. Further, while heat-producing system 200 is illustrated as containing only two heat-producing elements 204 and 206, in some embodiments heat-producing system 200 may contain several more. For example, in some embodiments heat-producing system may be a section of a server rack, and each heat-producing element may be a server module. Each server module may transfer heat from the module to a liquid-cooling system that shares a common loop among all the server modules in the section. The liquid cooling system may then direct that heat to the cooling fins in the heat-producing system, including cooling fins 202 and 210.

Figure 3A:
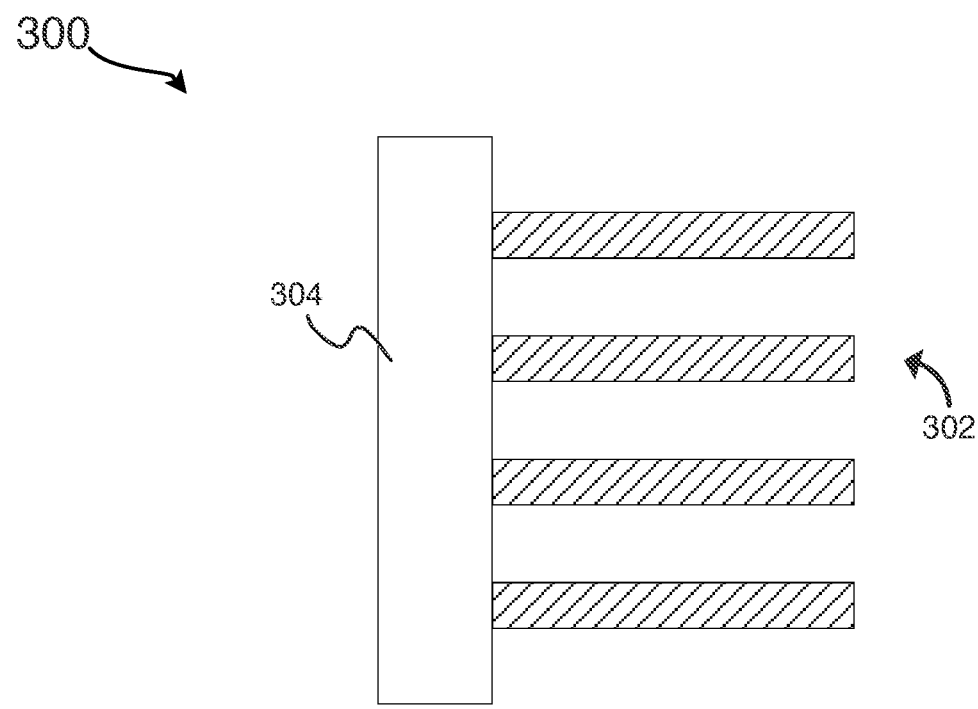
FIG. 3A depicts a top view of a set of pivotable fins in a deployed configuration.
Figure 3B:
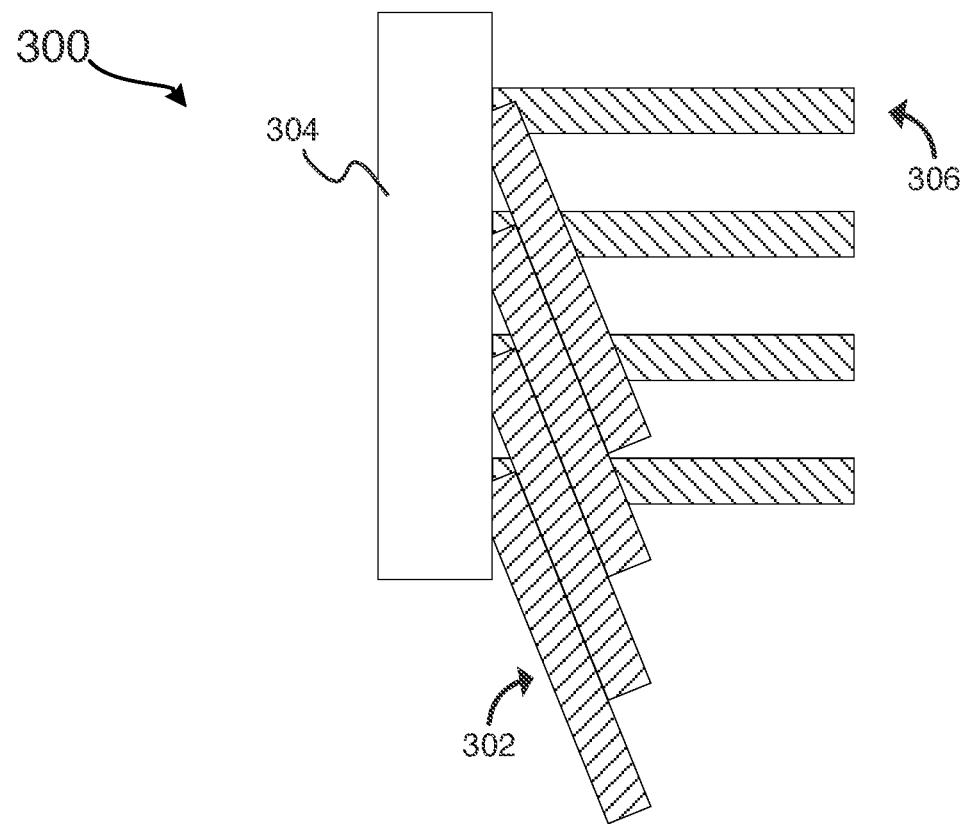
FIG. 3B depicts a top view of a set of pivotable fins in a non-deployed configuration.

FIGS. 3A and 3B illustrate a heat-producing system 300 whose cooling fins may be pivoted in order to reduce or increase the deployment level of the cooling fins. FIG. 3A illustrates a front view of heat-producing system 300. To ease in comprehension, this side view may depict a similar perspective to that illustrated in FIGS. 2B and 2D. In FIG. 3A, cooling fins 302 are illustrated in a fully deployed configuration. Cooling fins 302 are attached to base 304, which is depicted in a vertical orientation. Base 304 may, in some embodiments, take the form of a heatsink (e.g., a metal block with high thermal conductivity), a liquid-cooling reservoir (e.g., a portion of a liquid-cooling loop that delivers heated liquid from a heat-producing element to cooling fins 302), a housing of a vertically oriented server module, or others.

FIG. 3B illustrates a view of heat-producing system 300 after the deployment level of cooling fins 302 has been reduced by pivoting cooling fins 302 down. This deployment reduction has revealed cooling fins 306, which were previously obstructed from view by cooling fins 302. Cooling fins 306 may also be attached to base 304, or may be attached to an analogous base behind base 304.

As is evident by comparing FIG. 3B to FIG. 3A, cooling fins 306 may have access to a significantly higher amount of unobstructed airflow after the deployment level of cooling fins 302 was reduced. In FIG. 3A, 100% of the surface area of cooling fins 306 may have been receiving airflow that was disrupted by cooling fins 302, which may have negatively impacted the ability of that airflow to cool cooling fins 306. This may occur for reasons similar to those discussed with respect to cooling fins 210 in FIG. 2A. However, once cooling fins 302 are pivoted down, a significant amount of airflow may be capable of flowing past cooling fins 302 without being disrupted. This may, in turn, cause the airflow that reaches much of the surface area of cooling fins 306 to be more efficient at cooling fins 306.

The mechanism by which cooling fins 302 are able to pivot may not be of vital importance to the present disclosure. For example, cooling fins 302 may attach to base 304 with a hinge mechanism that allows movement of cooling fins 302, but also maintains a high degree of physical contact between cooling fins 302 and base 304, enabling heat transfer from base 304 to cooling fins 302. In other embodiments the hinge mechanism may be part of a liquid cooling loop that may cause heat to flow from a heat-producing element to cooling fins 302 through base 304.

As has been discussed previously, a machine-learning system, such as a neural network, may process and analyze input data related to a heat-producing system (here, a combination of temperature data, airflow data, current module activity data, and future module activity data) by recognizing patterns in the input data and comparing those patterns to patterns related to historical heat-producing systems (e.g., data centers) on which the neural network has been trained. For example, a neural network may recognize several patterns in the data expressed by an input vector for a particular set of cooling fins. The neural network may then associate some of those patterns with the patterns associated with historical sets of cooling fins that the neural network has been trained (e.g., by human-supervised training or automatic training) to quantify, for example, the cooling benefit provided by a set of cooling fins at a particular deployment level in a particular set of environmental circumstances. The neural network may also be trained, for example, to quantify the airflow detriment cause by the set of cooling fins at a particular deployment level in a particular set of environmental circumstances. In some embodiments, the neural network may also be trained to estimate an optimal deployment level for a set of fins given the cooling needs of one or more heat-producing elements being cooled by those cooling fins and the airflow needs of other cooling fins in the heat-producing system. These decisions may be passed on the environmental data for the heat-producing system that is available to the neural network.

Finally, a neural network may analyze environmental data for a heat-producing system and compare it to historical data to determine whether the heat-producing system may be cooled more effectively or efficiently if cooling fins with customizable deployment levels were added to the heat-producing system. For example, a neural network may analyze the plans for a particular data center, cabinet, or rack (or may analyze the environmental data of an already-existing particular data center, cabinet, or rack) and associate patterns in the particular data center, cabinet, or rack with patterns in historical data for historical data centers, cabinets, and racks. The neural network may identify similarities between the design of a set of particular cooling fins (and the surrounding environment) from the particular data center, cabinet, or rack and the design of a historical set of cooling fins in a historical data center, cabinet, or rack. If the particular cooling fins do not feature an adjustable deployment level, the historical cooling fins do feature an adjustable deployment level, and the historical system near the historical cooling fins is cooled more effectively, the neural network may predict that replacing the particular cooling fins with cooling fins that feature an adjustable deployment level may result in a more efficiently cooled heat-producing system.

In other instances, the neural network could compare patterns in a planned cabinet or data center to historical cabinets and data centers to determine whether cooling fins with adjustable deployment levels should be included in the cabinet or data center, and in which locations.

In some embodiments, data input into a neural network may take the form of a vector. A vector may be a one-dimension matrix (e.g., a matrix with one row and many columns) of numbers, each of which expresses data related to, for example, temperature, component usage statistics, and airflow. A vector may also be referred to herein as an "input vector," a "feature vector," or a "multi-dimension vector." For example, as previously discussed, this vector may include the component temperatures reported by heat-producing elements (e.g., the reported temperature of one or more CPU dies), the temperatures of surfaces in the area surrounding cooling fins, the air temperatures in various locations within a heat-producing system, information regarding the present and future activity of heat-producing elements in the heat-producing system, airflow measurements, and others.

Figure 4:
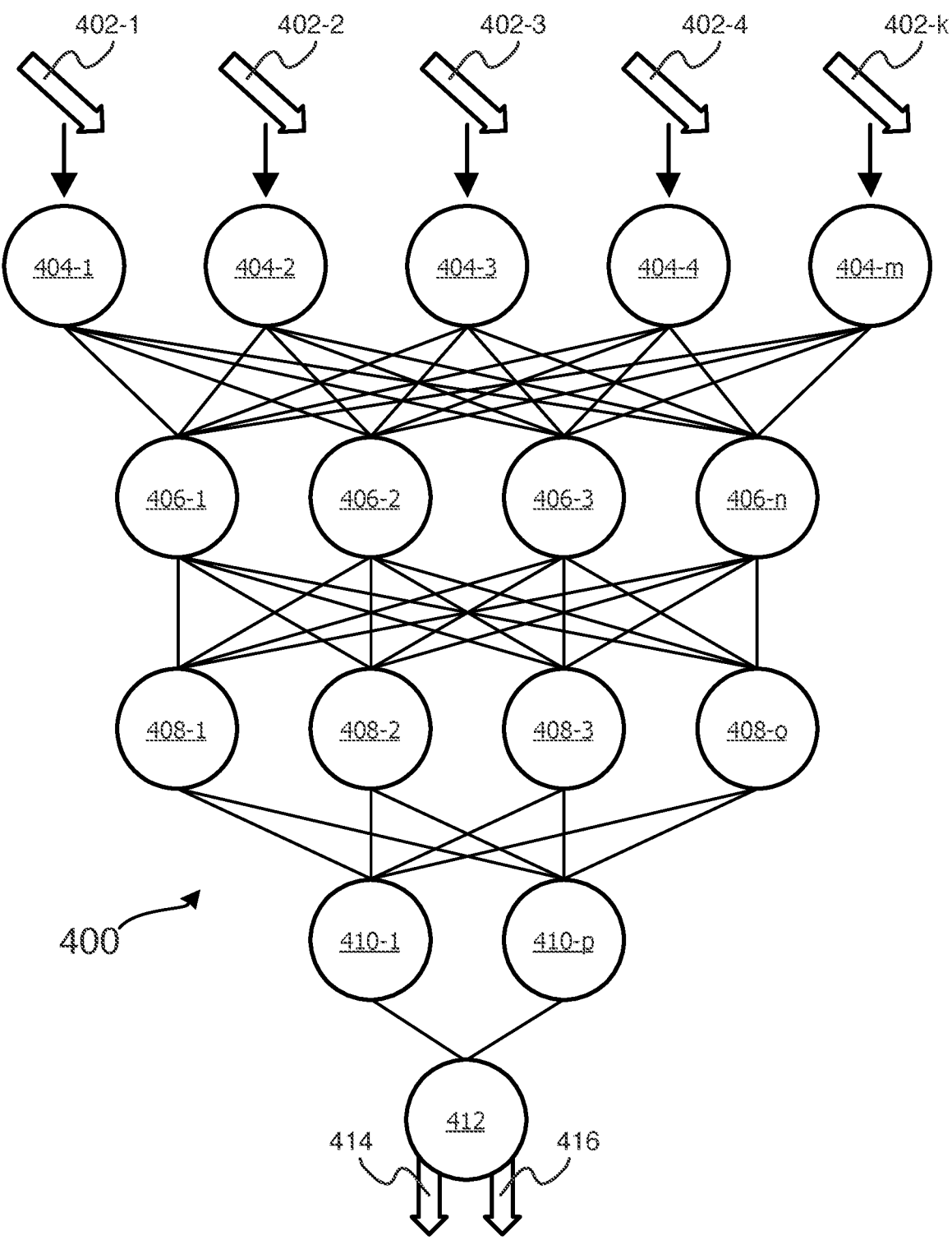
FIG. 4 illustrates the representative major components of a neural network that may be used in accordance with embodiments.

Such a neural network is illustrated in FIG. 4. In FIG. 4, neural network 400 may be trained to quantify cooling benefit of a set of cooling fins and airflow detriment of the set of cooling fins. The inputs of neural network 400 are represented by feature vectors 402-1 through 402-$k$. These feature vectors may contain all available information that is regarding the environment surrounding the cooling fins, and that is otherwise consistent with the present disclosure. In some embodiments, feature vectors 402-1 through 402-$k$ may be identical copies of each other. In some embodiments, more of instances of feature vectors 402 may be utilized. The number of feature vectors 402-1 through 402-$k$ may correspond to the number of neurons in feature layer 404. In other words, in some embodiments, the number of inputs 402-1 through 402-$k$ (i.e., the number represented by m) may equal (and thus be determined by) the number of first-layer neurons in the network. In other embodiments, neural network 400 may incorporate 1 or more bias neurons in the first layer, in which case the number of inputs 402-1 through 402-$k$ may equal the number of first-layer neurons in the network minus the number of first-layer bias neurons.

Feature layer 404 contains neurons 401-1 through 401-$m$. Neurons 404-1 through 404-$m$ accept as inputs feature vectors 402-1 through 402-$k$ and process the information therein. Once vectors 402-1 through 402-$k$ are processed, neurons 404-1 through 404-$m$ provide the resulting values to the neurons in hidden layer 406. These neurons, 406-1 through 406-$n$, further process the information, and pass the resulting values to the neurons in hidden layer 408. Similarly, neurons 408-1 through 408-$o$ further process the information and pass it to neurons 410-1 through 410-$p$. Neurons 410-1 thorough 410-$p$ process the data and deliver it to the output layer of the neural network, which, as illustrated, contains neuron 412. Neuron 412 may be trained to calculate two values—value 414 and value 416. Value 414 may represent a percentage indication of a cooling benefit to a heat-producing element at a set of cooling fins' deployment level. Value 416, on the other hand, may represent the opposite of that percentage.

In some embodiments, neural network 400 may have more than 5 layers of neurons (as presented) or fewer than 5 layers. These 5 layers may each comprise the same amount of neurons as any other layer, more neurons than any other layer, fewer neurons than any other layer, or more neurons than some layers and fewer neurons than other layers. Finally, in some embodiments, the output of output layer 412 may be used to determine whether to increase the deployment level of a set of cooling fins, whether to reduce the deployment level of a set of cooling fins, or whether to install more cooling fins with a customizable deployment level.

Figure 5:
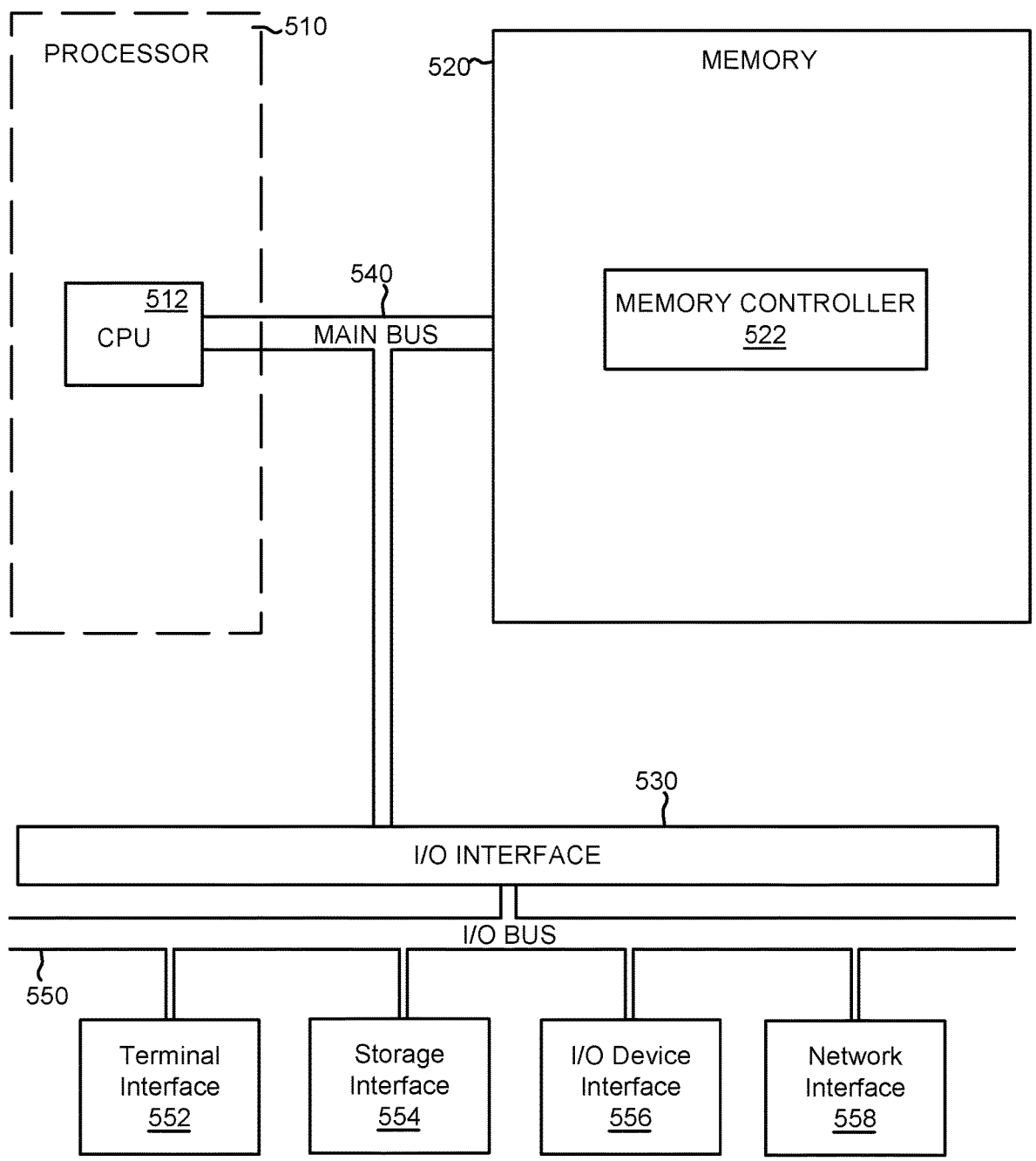
FIG. 5 depicts the representative major components of a computer system that may be used in accordance with embodiments.

FIG. 5 depicts the representative major components of an example Computer System 501 that may be used in accordance with embodiments of the present disclosure. The particular components depicted are presented for the purpose of example only and are not necessarily the only such variations. The Computer System 501 may include a Processor 510, Memory 520, an Input/Output Interface (also referred to herein as I/O or I/O Interface) 530, and a Main Bus 540. The Main Bus 540 may provide communication pathways for the other components of the Computer System 501. In some embodiments, the Main Bus 540 may connect to other components such as a specialized digital signal processor (not depicted).

The Processor 510 of the Computer System 501 may include one or more CPUs 512. The Processor 510 may additionally include one or more memory buffers or caches (not depicted) that provide temporary storage of instructions and data for the CPU 512. The CPU 512 may perform instructions on input provided from the caches or from the Memory 520 and output the result to caches or the Memory 520. The CPU 512 may include one or more circuits configured to perform one or methods consistent with embodiments of the present disclosure. In some embodiments, the Computer System 501 may contain multiple Processors 510 typical of a relatively large system. In other embodiments, however, the Computer System 501 may be a single processor with a singular CPU 512.

The Memory 520 of the Computer System 501 may include a Memory Controller 522 and one or more memory modules for temporarily or permanently storing data (not depicted). In some embodiments, the Memory 520 may include a random-access semiconductor memory, storage device, or storage medium (either volatile or non-volatile) for storing data and programs. The Memory Controller 522 may communicate with the Processor 510, facilitating storage and retrieval of information in the memory modules. The Memory Controller 522 may communicate with the I/O Interface 530, facilitating storage and retrieval of input or output in the memory modules. In some embodiments, the memory modules may be dual in-line memory modules.

The I/O Interface 530 may include an I/O Bus 550, a Terminal Interface 552, a Storage Interface 554, an I/O Device Interface 556, and a Network Interface 558. The I/O Interface 530 may connect the Main Bus 540 to the I/O Bus 550. The I/O Interface 530 may direct instructions and data from the Processor 510 and Memory 520 to the various interfaces of the I/O Bus 550. The I/O Interface 530 may also direct instructions and data from the various interfaces of the I/O Bus 550 to the Processor 510 and Memory 520.

The various interfaces may include the Terminal Interface 552, the Storage Interface 554, the I/O Device Interface 556, and the Network Interface 558. In some embodiments, the various interfaces may include a subset of the aforementioned interfaces (e.g., an embedded computer system in an industrial application may not include the Terminal Interface 552 and the Storage Interface 554).

Logic modules throughout the Computer System 501—including but not limited to the Memory 520, the Processor 510, and the I/O Interface 530—may communicate failures and changes to one or more components to a hypervisor or operating system (not depicted). The hypervisor or the operating system may allocate the various resources available in the Computer System 501 and track the location of data in Memory 520 and of processes assigned to various CPUs 512. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of customizing the cooling of a first heat-producing system, the method comprising:
    selecting a first set of cooling fins with a first deployment level, wherein the first set of cooling fins is configured to cool a first heat-producing element and wherein the cooling fins are deployable and retractable heatsink fins;
    analyzing environmental data for an environment associated with the first set of cooling fins;
    quantifying, based on the analysis, a cooling benefit of the first deployment level;
    quantifying, based on the analysis, an airflow detriment of the first deployment level;
    determining that the airflow detriment outweighs the cooling benefit; and
    reducing the deployment level based on the determination, wherein the reducing comprises controlling the deployment level of the cooling fins to a target deployment level, resulting in a reduced deployment level.

2. The method of claim 1, wherein quantifying the cooling benefit comprises:
    estimating a surface area of cooling fins that would be necessary to cool the first heat-producing element under a current set of conditions; and
    comparing the estimated surface area with a surface area of the cooling fins at the deployment level.

3. The method of claim 1, wherein the cooling benefit is weighted by the value of the task being performed by the first heat-producing element.

4. The method of claim 1, wherein the airflow detriment is weighted by the performance of a second heat-producing element.

5. The method of claim 1, wherein the environmental data includes a temperature recorded by laser thermometer.

6. The method of claim 1, wherein reducing the deployment level comprises retracting a retractable portion of the first set of cooling fins into a cavity of the first set of cooling fins.

7. The method of claim 6, wherein the retractable portion is retracted by reducing a pressure of a hydraulic fluid inside the cavity.

8. The method of claim 1, wherein the first set of cooling fins is located on the housing of a server module.

9. The method of claim 1, wherein the environmental data comprises a scheduled workload of the first heat-producing element.

10. The method of claim 1, wherein analyzing the environmental data comprises inputting the environmental data into a machine-learning system, wherein the machine-learning system is trained to a first pattern in the environmental data with a second pattern in historical data pertaining, wherein the historical data pertains to a second heat-producing systems.

11. The method of claim 10, wherein the second heat-producing system is the first heat-producing system, and wherein the historical data pertains to past workloads of the first heat-producing element.

12. The method of claim 1, wherein reducing the deployment level comprises changing the angle of the first set of cooling fins.

13. The method of claim 1, further comprising:
monitoring, by a sensor in the heat-producing system, a temperature in the heat-producing system;
determining that the temperature is above a pre-determined threshold;
wherein the selecting the first set of cooling fins is based on the determining that the temperature is above a pre-determined threshold.

14. A heat-producing system comprising:
a first heat-producing element that is configured to be cooled by a first set of cooling fins, wherein the first set of cooling fins has a first deployment level and wherein the cooling fins in the first set of cooling fins are heatsink fins;
a second heat-producing element that is configured to be cooled by a second set of cooling fins; and
a cooling management system that comprises:
a processor; and
a memory in communication with the processor, the memory containing program instructions that, when executed by the processor, are configured to cause the processor to perform a method, the method comprising:
quantifying a cooling benefit of the first set of cooling fins on the first heat-producing element;
quantifying an airflow detriment of the first set of cooling fins on the second heat-producing element;
determining that the cooling benefit outweighs the airflow detriment;
determining that an increased deployment level is implicated; and
increasing the deployment level, wherein the increasing comprises controlling the deployment level of the cooling fins to a target deployment level, resulting in an increased deployment level.

15. The heat-producing system of claim 14, wherein the first heat-producing element is a first server module, and the second heat-producing element is a second sever module.

16. The heat-producing system of claim 14, wherein the first heat-producing element is a first component of a server module, and the second heat-producing element is a second component of the server module.

17. The heat-producing system of claim 14, wherein determining that an increased deployment level is implicated comprises predicting that further deployment of the first set of cooling fins would increase the performance of the first heat-producing element.

18. A computer program product, the computer program product comprising a computer readable storage medium having program instructions embodied therewith, the program instructions executable by a computer to cause the computer to:
select a first set of cooling fins with a first deployment level, wherein the set of cooling fins is configured to cool a first heat-producing element, wherein the cooling fins in the first set of cooling fins are attached to a heatsink;
analyze environmental data for an environment associated with the first set of cooling fins;
quantify, based on the analysis, a cooling benefit of the first deployment level;
quantify, based on the analysis, an airflow detriment of the first deployment level and downstream of the first set of cooling fins;
determine that the airflow detriment outweighs the cooling benefit; and
reduce the deployment level based on the determination, wherein the reducing comprises controlling the deployment level of the cooling fins to a target deployment level, resulting in a reduced deployment level.

19. The computer program product of claim 18, wherein the quantifying the cooling benefit comprises:
estimating a surface area of cooling fins that would be necessary to cool the first heat-producing element under a current set of conditions; and
comparing the estimated surface area with a surface area of the cooling fins at the deployment level.

20. The computer program product of claim 18, wherein analyzing the environmental data comprises inputting the environmental data into a machine-learning system, wherein the machine-learning system is trained to a first pattern in the environmental data with a second pattern in historical data pertaining, wherein the historical data pertains to a second heat-producing systems.

* * * * *